United States Patent [19]

Higashi et al.

[11] 4,284,965
[45] Aug. 18, 1981

[54] TONE CONTROL DEVICE

[75] Inventors: Ryozi Higashi; Hiroyuki Hirano, both of Tokorozawa, Japan

[73] Assignee: Pioneer Electronic Corporation, Tokyo, Japan

[21] Appl. No.: 74,026

[22] Filed: Sep. 10, 1979

[30] Foreign Application Priority Data

Sep. 11, 1978 [JP] Japan ............................ 53/110614
Sep. 19, 1978 [JP] Japan ............................ 53/114031
Sep. 22, 1978 [JP] Japan ............................ 53/115987

[51] Int. Cl.³ .......................................... H03H 7/01
[52] U.S. Cl. ............................ 333/28 T; 179/1 D; 330/109; 330/126
[58] Field of Search ................ 333/28 R, 28 T; 330/126, 109; 179/1 D

[56] References Cited

U.S. PATENT DOCUMENTS 3,921,104  11/1975  Gundry ........................... 333/28 T X
4,074,204  2/1978   Broburg et al. ................ 333/28 R X
4,186,274  1/1980   Mayshar ......................... 333/28 T X Primary Examiner—Paul L. Gensler
Attorney, Agent, or Firm—Sughrue, Rothwell, Mion, Zinn and Macpeak

[57] ABSTRACT

A tone control device for an audio equipment comprises a first mixer amplifier, at least one second mixer, a third mixer and at least one band rejection filter, which are operatively engaged with each other such that a center frequency, Q value and gain thereof can be independently controlled.

7 Claims, 10 Drawing Figures

TONE CONTROL DEVICE

BACKGROUND OF THE INVENTION

The present invention relates to a tone control device for an audio equipment.

One of the channels of a graphic equalizer, which is a tone control device, can be provided by using a circuit which satisfies the following transmission function $T_{(s)}$:

$$T_{(s)} = \frac{S^2 + \frac{\omega_o}{Q} S(K_2 + 1) + \omega_o^2}{S^2 + \frac{\omega_o}{Q} S(K_1 + 1) + \omega_o^2} \quad (1)$$

where S is the Laplace operator, $\omega_o$ is center angular frequency, Q is sharpness, $K_1$ is attenuation factor at the angular frequency $\omega_o$ and $K_2$ is amplification factor at the angular frequency $\omega_o$.

By commonly dividing the numerator and the dominator of the right hand term of equation (1) by $S^2$ and then multiplying the results of the divisions with a certain common conditional parameters, respectively, the following equation (2) is obtained.

$$T_{(s)} = \frac{x + \frac{\omega_o}{S}\left(\frac{K_2+1}{Q}\right)x + \frac{\omega_o^2}{S^2}x}{x + \frac{\omega_o}{S}\left(\frac{K_1+1}{Q}\right)x + \frac{\omega_o^2}{S^2}x} \quad (2)$$

The numerator and the dominator of the right hand term of the equation (2) are divided by a common constant $$\left(1 + \frac{\omega_o}{S} \cdot \frac{1}{Q} + \frac{\omega_o^2}{S^2}\right),$$

respectively. The result is as follows:

$$T_{(s)} = \frac{x + xB_{(s)}K_2}{x + xB_{(s)}K_1} \quad (3)$$

where $B_{(s)}$ is a transmissions function of a bandpass filter, which can be represented as follows:

$$B_{(s)} = \frac{\frac{\omega_o}{Q} S}{S^2 + \frac{\omega_o}{Q} S + \omega_o^2} \quad (4)$$

Since $T_{(s)} = e_o/e_i$, where $e_i$ and $e_o$ are an input voltage and an output voltage of the channel, the followings are obtained:

$$x = e_i - xB_{(s)}K_1$$
$$e_o = x + xB_{(s)}K_2 \quad (5)$$

FIG. 1 shows a block diagram of a circuit which satisfies the equations (5) and FIG. 2 shows an example of concrete circuits embodying the block circuit in FIG. 1, in which a reference numeral 10 shows a band pass filter having transmission function $B_{(s)}$ and 13 and 14 are amplifiers.

FIG. 2 shows an example of the conventional tone control device which comprises a plurality (n) of parallel connected bandpass filters each constituted as shown in FIG. 2 to boost or cut the grains thereof at a corresponding number (n) of respective specific frequencies. In FIG. 2, outputs of the bandpass filter $10_1$ to $10_n$ are connected through variable resistors $12_1$ to $12_n$ to the amplifiers 13 and 14, respectively. In this conventional tone control device, there is a problem of degradation of signal quality. This problem becomes more severe when the Q values and the center angular frequencies are to be variable.

SUMMARY OF THE INVENTION

An object of the present invention is to provide an improved tone control device by which the problem of the signal quality degradation is overcome.

Another object of the present invention is to provide an improved tone control device by which, in addition to the resolution of the signal quality problem, the circuit construction becomes simpler with a minimum number of circuit elements.

The above objects can be achieved by utilizing band rejection filter or filters rather than bandpass filters.

DETAILED DESCRIPTION OF THE PREFERRED EMBODIMENT

Figure 1:
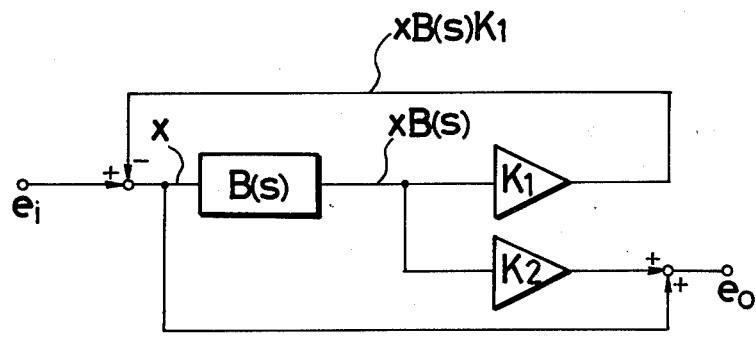
FIG. 1 is a block diagram of a conventional tone control device having a single channel.
Figure 2:
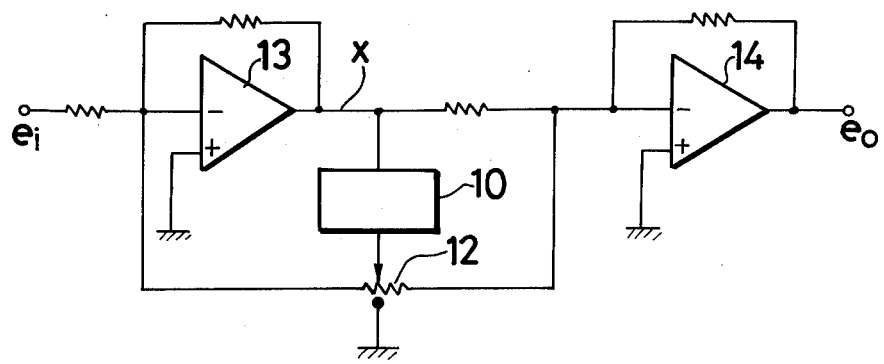
FIG. 2 is a circuit diagram of the device in FIG. 1.
Figure 3:
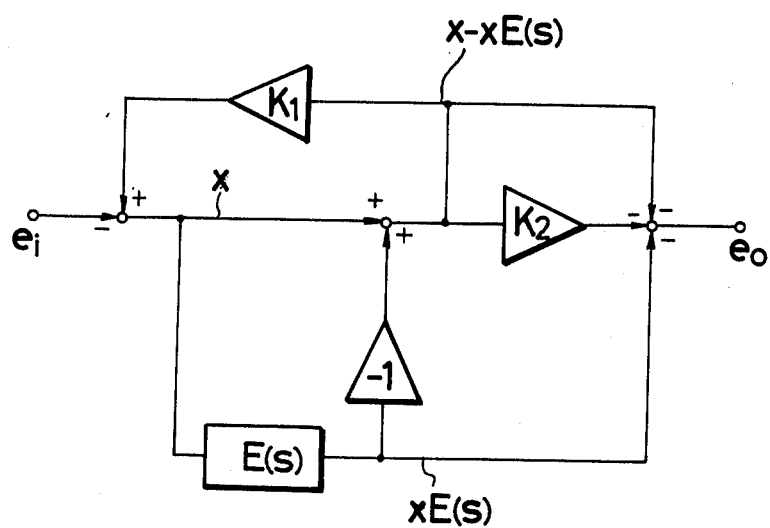
FIG. 3 is a block diagram of a tone control device according to the present invention.

FIG. 3 shows, in block form, an embodiment of the present invention. The circuit in FIG. 3 satisfies the following equations which satisfy the equation (1):

$$x = -e_i - K_1\{x - xE_{(s)}\}$$
$$e_o = -x - K_2\{x - xE_{(s)}\} \quad (6)$$

where $E_{(s)}$ is a transmission function of a band rejection filter, which is as follows:

$$E_{(s)} = 1 - B_{(s)}$$
$$= \frac{S^2 + \omega_o^2}{S^2 + \frac{\omega_o}{Q} S + \omega_o^2} \quad (7)$$

Figure 4:
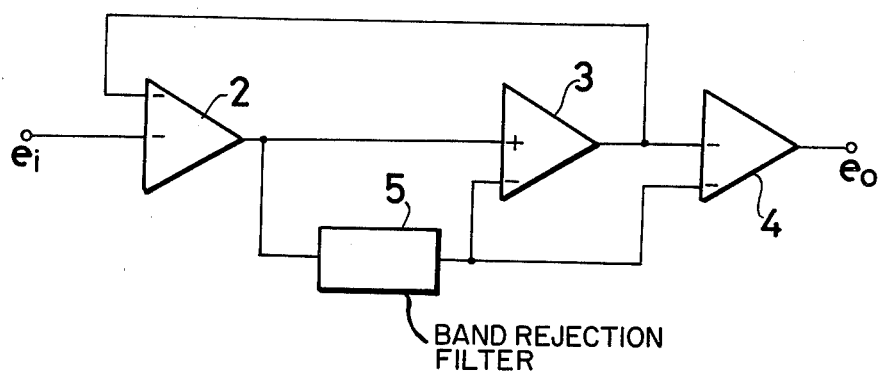
FIG. 4 is a schematic circuit diagram of the device in FIG. 3.

FIG. 4 is an example of a concrete circuit embodying the block circuit in FIG. 3, which includes a first mixer amplifier 2, whose output is the functional parameter x, a second mixer amplifier 3, a third mixer amplifier 4 and a band rejection filter 5. The mixer amplifier 2 has an input for receiving an input signal $e_i$ and another input connected to an output of the second mixer amplifier 3. The mixer amplifier 2 functions to mix the input signal $e_i$ and the output of the second mixer 3 and to make the gain $K_1$ variable by changing the mixing ratio therebetween to provide a "CUT" function.

An output of the mixer amplifier 2 is connected to one input of the second mixer amplifier 3 and to an input of the band rejection filter 5 whose output is connected to the other input of the mixer amplifier 3.

The output of the mixer amplifier 3 is connected to one input of the third mixer amplifier 4 whose the other input is connected to the output of the filter 5.

The mixer amplifier 4 functions to combine the output of the mixer amplifier 3 and hence the amplified output of the mixer amplifier 2 and the output of the filter 5 to make the gain $K_2$ variable by changing the mixing ratio between the outputs of the mixer amplifier 3 and the filter 5 to provide a "BOOST" function.

Figure 5:
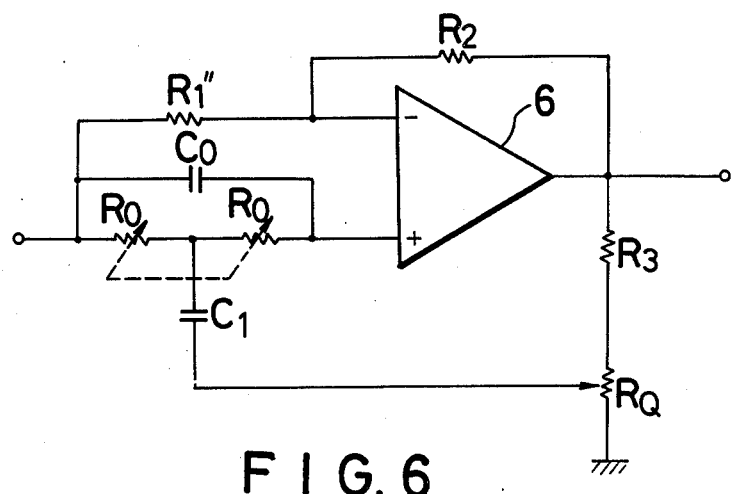
FIG. 5 is a circuit diagram of a band rejection filter of the device in FIG. 4.

FIG. 5 shows a circuit of the band rejection filter 5 in FIG. 4. In FIG. 5, the band rejection filter 5 is constituted with a pair of variable resistors $R_o$, a capacitor $C_o$ connected in parallel with the series variable resistors $R_o$, a resistor $R_1''$ connecting an input terminal of the parallel resistor-capacitor circuit to one input of a differential amplifier 6 whose other input is connected to an output terminal of the parallel resistor-capacitor circuit, a resistor $R_2$ connecting an output of the differential amplifier 6, a resistor 3 having one end connected to the output of the differential amplifier 6, a variable resistor $R_Q$ having one end connected to the other end of the resistor $R_3$ and the other end grounded, and a capacitor $C_1$ having one end connected to a junction of the variable resistors and the other end connected to a slide contact of the variable resistor $R_Q$, which constitutes, together with the latter variable resistors, a T type filter.

Figure 6:
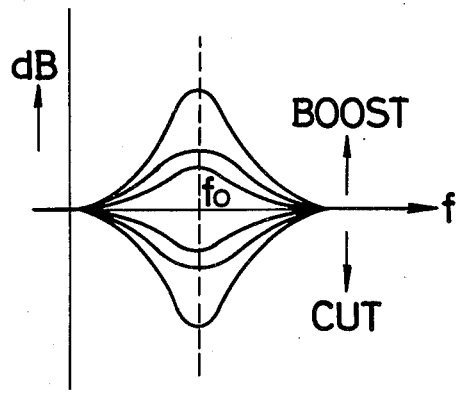
FIG. 6 is a graph showing the frequency characteristics of the device in FIG. 4.

The center frequency of the T type filter can be independently varied by regulating the values of the variable resistors $R_o$ simultaneously and Q value can also be independently varied by regulating the variable resistor $R_Q$ which determines the positive feedback amount of the differential amplifier 6, as shown in FIG. 6.

According to the circuit in FIGS. 5 and 6, it becomes possible to vary the center frequency, the gain and the Q value independently of each other with a minimum number of the circuit elements.

For a plurality of n channels for making the frequency characteristics at a plurality of frequencies variable, it may be possible to cascade-connect the corresponding number of the circuits each shown in FIG. 4. It has been found that the cascade connection of the circuits in FIG. 4 is satisfactory for the purpose. In this case, however, another problem arises which is a degradation of the signal in view of the Klirr factor and noise.

According to another embodiment of the present invention, a plurality of n channels each shown in FIG. 4 are connected in parallel to minimize the effects of noise and Klirr factor.

Figure 7:
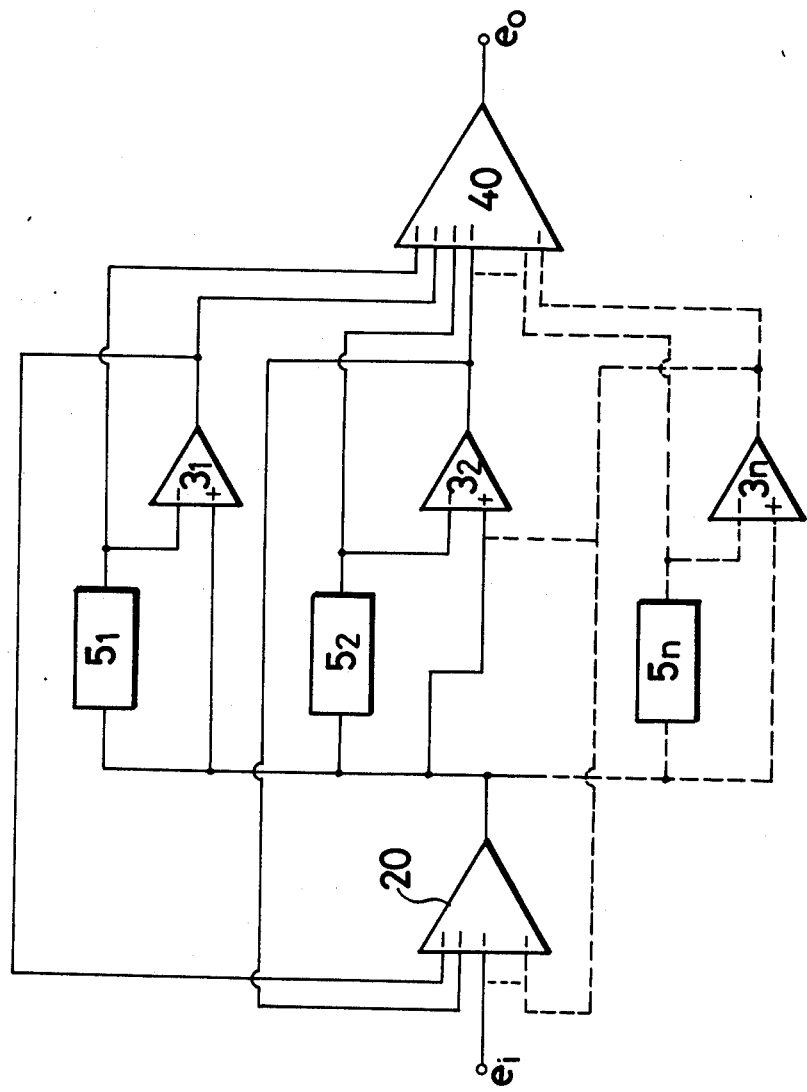
FIG. 7 is another embodiment of the present tone control device having a plurality of channels.

In FIG. 7, the second embodiment in block diagram is shown, in which the mixer amplifier 2 in FIG. 4 is substituted by a mixer amplifier 20 which has 2n inputs and the mixer amplifier 4 in FIG. 4 is substituted by a mixer amplifier 40 which has 2n inputs, each being engaged with different one of n parallel channels and comprising the band rejection filters $5_i$ and the mixer amplifier $3_i$ connected as shown in FIG. 7, where i = 1, 2 ..., n.

The band rejection filters $5_i$ have a transmission function $E_{i(s)}$ which is as follows:

$$E_{i(s)} = \frac{S^2 + \omega_i^2}{S^2 + \frac{\omega_i}{Q_i} S + \omega_i^2} \quad (8)$$

The gain of each channel is attenuated or "CUT" at a frequency $f_i$ (= $\omega_i/2\pi$) when the output of the mixer amplifier $3_i$ is amplified with amplification factor $K_1$ and combined in the mixer amplifier 20, and is increased ("BOOST") at the frequency when the output of the mixer amplifier $3_i$ is amplified with amplification ($K_2 + 1/i$) and combined in the mixer amplifier 40. Furthermore, by changing the center frequency $f_i$ and the value $Q_i$ of the band rejection filter $S_i$, respectively, a desired frequency characteristics can be obtained.

The transmission function $T_{(s)} = e_o/e_i$ of the whole circuit shown in FIG. 7 become as follows.

$$T_{(s)} = \frac{1 + K_2\{1 - E_{1(s)}\} + K_4\{1 - E_{2(s)}\} + \ldots + K_\beta\{1 - E_{n(s)}\}}{1 + K_1\{1 - E_{1(s)}\} + K_3\{1 - E_{2(s)}\} + \ldots + K_\alpha\{1 - E_{n(s)}\}} \quad (9)$$

where $K_\alpha$ is the mixing amplification factor with which the gain of the channel n is reduced and $K_\beta$ is the mixing amplification factor with which the gain of the channel n is increased.

Figure 8:
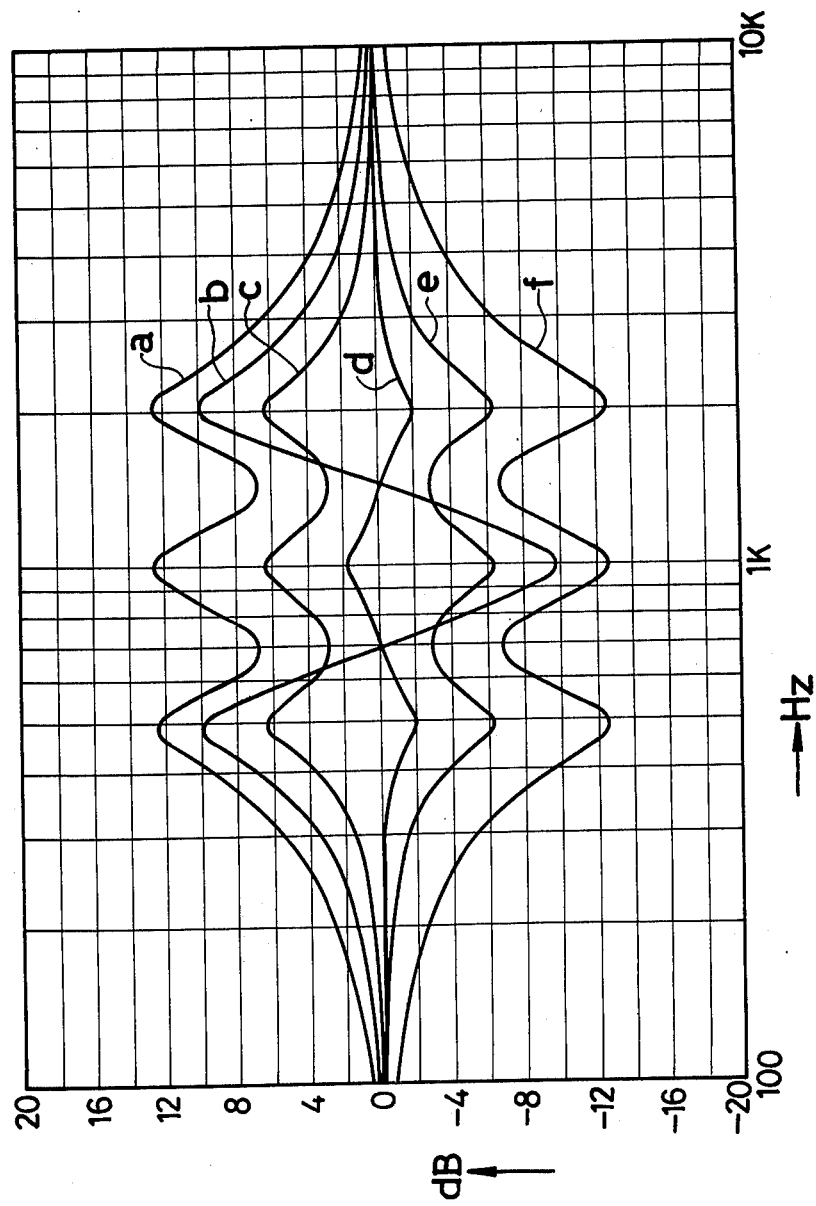
FIG. 8 is a graph showing the frequency characteristics of the device in FIG. 7, where three channels are involved.

FIG. 8 shows various frequency characteristics a to f of the circuit construction in FIG. 7 where n is 3, which the center frequencies $f_1$, $f_2$ and $f_3$ of the band rejection filters $5_1$, and $5_2$ and $5_3$ are 500 Hz, 1 KHz and 2 KHz, respectively, and the Q value of each filter in commonly 3.

Table 1 shows the gains at the center frequencies of the respective filters $5_1$ to $5_3$.

TABLE 1

| | 500 Hz | 1 KHz | 2 KHz |
|---|---|---|---|
| a | 12dB. BOOST | 12dB. BOOST | 12dB. BOOST |
| b | 12dB. BOOST | 12dB. CUT | 12dB. BOOST |
| c | 6dB. BOOST | 6dB. BOOST | 6dB. BOOST |
| d | 2dB. CUT | 2dB. BOOST | 2dB. CUT |
| e | 6dB. CUT | 6dB. CUT | 6dB. CUT |
| f | 12dB. CUT | 12dB. CUT | 12dB. CUT |

According to this embodiment, there is no mutual interference between adjacent channels and the effects of noise and Klirr factor of the whole circuit are much improved thereby, with the advantages of the independent regulation of the center frequencies, the Q values and the gains with the minimum number of circuit element.

It may be advisable to provide an impedance transforming buffer amplifier having an input connected to the slide contact of the resistor $R_Q$ and an output connected to one end of the capacitor $C_1$ having the other end connected to the junction of the variable resistors $R_o$ so that the impedance as seen by capacitor $C_1$ is zero in order to balance the "T" type bridge circuit. When the provision of such buffer amplifier is undesirable while the effect thereof is still required, the buffer amplifier may be omitted by modifying the filter circuit itself.

Figure 9:
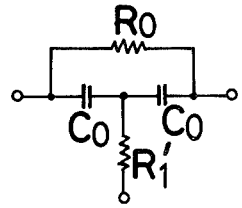
FIG. 9 is an equivalent circuit of a portion of the band rejection filter in FIG. 5.

According to another embodiment of the present invention the T type circuit which is shown in FIG. 5 and is composed of the series resistors $R_o$, capacitor $C_o$ connected in parallel to the series resistors and the capacitor $C_1$ connected to the junction of the resistors $R_o$ is substituted by an equivalent T type circuit shown in FIG. 9.

In FIG. 9, the T type circuit comprises a pair of series connected capacitors $C_o$, a resistor $R_o$ connected in parallel to the series capacitors and a resistor $R_1'$ connected to the junction of the capacitor $C_o$. According to the present invention in FIG. 10 the resistor $R_1'$ is eliminated and the function to be performed by the resistor $R_1'$ is assigned to the feedback resistors $R_1$ and $R_3$.

Figure 10:
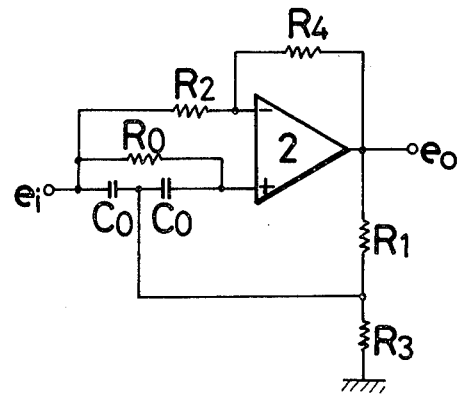
FIG. 10 is another embodiment of the band rejection filter.

FIG. 10 shows the band rejection filter in FIG. 5 modified according to the usage of the equivalent circuit of the T type circuit in FIG. 9 and the elimination of the feedback determining resistor.

The transmission function $T_{(s)}$ of the circuit in FIG. 10 is as follows:

$$T_{(s)} = \frac{e_o}{e_i} = \frac{S + S\frac{1}{C_o}\left\{\frac{2}{R_o} - \frac{R_4}{R_2}\left(\frac{1}{R_1} + \frac{1}{R_3}\right)\right\} + \frac{1}{C_o^2 R_o}\left(\frac{1}{R_1} + \frac{1}{R_3}\right)}{S^2 + S\frac{1}{C_o}\left\{\frac{1}{R_3} + \frac{2}{R_o} - \frac{R_4}{R_1 R_2}\right\} + \frac{1}{C_o^2 R_o}\left(\frac{1}{R_1} + \frac{1}{R_3}\right)}$$

In order to operate this filter as a band rejection filter, it should be $$\frac{2}{R_o} - \frac{R_4}{R_2}\left(\frac{1}{R_1} + \frac{1}{R_3}\right) = 0.$$

Therefore $(1/R_1) + (1/R_3) = (1/R_o)$ $R_4/R_2 = 2$

By determining the values of $R_1$, $R_2$, $R_3$ and $R_o$ such that they satisfy the above relations, the resistor $R_1'$ to be connected to the junction of the capacitors $C_o$ can be eliminated.

What is claimed is:

1. A tone control device for audio equipment, comprising: a first mixer amplifier having a plurality of input terminals and an output terminal, one of said input terminals being fed with an input signal, a first band rejection filter having an output terminal and an input terminal connected to said output terminal of said first mixer amplifier for providing variable frequency characteristic of a signal channel assigned thereto, a second mixer amplifier having one input terminal connected to said output terminal of said first mixer amplifier, another input terminal connected to said output terminal of said first band rejection filter, and an output terminal, a third mixer amplifier having a plurality of input terminals and an output terminal, one of said input terminals of said third mixer amplifier being connected to said output terminal of said first band rejection filter and another of said input terminals of said third mixer amplifier being connected to said output terminal of said second mixer amplifier and to another input terminal of said first mixer, the ratio of said output of said second mixer amplifier to said input signal, and the ratio of the output of said second mixer to the output of said band rejection filter being variable at said first and third mixers, respectively, to control a gain of said tone control device at a desired frequency.

2. A tone control device for audio equipment claimed in claim 1, wherein said band rejection filter comprises a first circuit means including a pair of series connected first resistors, a first capacitor connected in parallel with said series resistors, and a second capacitor having one end connected to a junction of said series resistors, a differential amplifier having one input connected to one end of said series resistors, another input connected through a second resistor to the other end of said series resistors, and an output grounded through a third resistor, a second circuit means connecting the other end of said second capacitor through a portion of said third resistor to the ground and a means including a fourth resistor for providing a feedback circuit for said differential amplifier.

3. A tone control device for audio equipment claimed in claim 2, wherein both of said series connected resistors are variable resistors.

4. A tone control device for audio equipment claimed in claim 3, wherein said portion of said third resistor is variable.

5. A tone control device for audio equipment claimed in any of claims 1 to 4, further comprising a plurality of fourth mixer amplifiers each having the same construction as that of said second mixer amplifier and having one input terminal connected to said output terminal of said first mixer amplifier and an output terminal connected to a different one of said input terminals of said third mixer amplifier, a plurality of second band rejection filters each having the same construction as that of said first band rejection filter, each of said second band rejection filters having an input terminal connected to said output terminal of said first mixer amplifier and an output terminal connected to the other input terminal of different ones of said fourth mixer amplifiers and to different ones of said input terminals of said third mixer amplifier.

6. A tone control device for audio equipment claimed in claim 1, wherein said first band rejection filter comprises a first circuit means including a pair of series connected capacitors and a first resistor connected in parallel with said series capacitors, a differential amplifier having one input connected to one end of said series capacitors, another input connected through a second resistor to the other end of said series capacitors and an output grounded through a third resistor, a second circuit means connecting a junction of said series capacitors through a portion of said third resistor to the ground and a means including a fourth resistor for providing a feedback circuit for said differential amplifier.

7. A tone control device for audio equipment claimed in claim 6, further comprising a plurality of fourth mixer amplifiers each having the same construction as that of said second mixer amplifier and having one input terminal connected to said output terminal of said first mixer amplifier and an output terminal connected to different ones of said input terminals of said third mixer amplifier, a plurality of second band rejection filters each having the same construction as that of said first band rejection filter, each of said second band rejection filters having an input terminal connected to said output terminal of said first mixer amplifier and an output terminal connected to the other input terminal of different ones of said fourth mixer amplifier and to different ones of said input terminals of said third mixer amplifier.

* * * * *